US009489894B2

(12) United States Patent
Yin et al.

(10) Patent No.: US 9,489,894 B2
(45) Date of Patent: Nov. 8, 2016

(54) PIXEL CIRCUIT AND DRIVING METHOD THEREOF, AND THIN FILM TRANSISTOR BACKBOARD

(71) Applicant: BOE TECHNOLOGY GROUP CO., LTD., Beijing (CN)

(72) Inventors: Jingwen Yin, Beijing (CN); Zhongyuan Wu, Beijing (CN); Lirong Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 37 days.

(21) Appl. No.: 14/437,031

(22) PCT Filed: Aug. 29, 2014

(86) PCT No.: PCT/CN2014/085494
§ 371 (c)(1),
(2) Date: Apr. 20, 2015

(87) PCT Pub. No.: WO2015/051682
PCT Pub. Date: Apr. 16, 2015

(65) Prior Publication Data
US 2015/0287360 A1     Oct. 8, 2015

(30) Foreign Application Priority Data
Oct. 9, 2013  (CN) .......................... 2013 1 0468312

(51) Int. Cl.
*G09G 3/32* (2016.01)
*H01L 27/32* (2006.01)

(52) U.S. Cl.
CPC .......... *G09G 3/3258* (2013.01); *G09G 3/3233* (2013.01); *H01L 27/3248* (2013.01); *H01L 27/3262* (2013.01); *H01L 27/3265* (2013.01);
(Continued)

(58) Field of Classification Search
None
See application file for complete search history.

(56) References Cited

U.S. PATENT DOCUMENTS 7,277,071 B2   10/2007   Oh
7,414,599 B2    8/2008   Chung et al.
(Continued)

FOREIGN PATENT DOCUMENTS

| CN | 1517965 A | 8/2004 |
|---|---|---|
| CN | 1577453 A | 2/2005 |

(Continued)

OTHER PUBLICATIONS

International Search Report of PCT/CN2014/085494 in Chinese with English Translation, mailed Nov. 25, 2014.
(Continued)

*Primary Examiner* — Joseph Feild
*Assistant Examiner* — Emily Frank
(74) *Attorney, Agent, or Firm* — Collard & Roe, P.C.

(57) ABSTRACT

There is provided a pixel circuit comprising a driving transistor (DTFT), a signal loading module, a light emitting control module and a storage capacitor (Cs). The pixel circuit can effectively eliminate the non-uniformity due to the threshold voltage of the driving transistor (DTFT) itself and the afterimage phenomenon due to the threshold voltage drift when driving the OLED, avoid the display brightness non-uniformity due to different threshold voltages of the driving transistors (DTFT) between the OLEDs of different pixel units. There is further provided a driving method for the above pixel circuit and a TFT backboard comprising the above pixel circuit.

17 Claims, 6 Drawing Sheets

(52) U.S. Cl.
CPC ... *H01L 27/3276* (2013.01); *G09G 2300/0809* (2013.01); *G09G 2300/0842* (2013.01); *G09G 2300/0861* (2013.01); *G09G 2320/0219* (2013.01); *G09G 2320/0626* (2013.01)

(56) References Cited

U.S. PATENT DOCUMENTS

| | | | |
|---|---|---|---|
| 8,294,737 | B2 | 10/2012 | Tanikame et al. |
| 8,754,912 | B2 | 6/2014 | Tanikame et al. |
| 2006/0232521 | A1 | 10/2006 | Jang et al. |
| 2007/0210998 | A1 | 9/2007 | Chiou et al. |
| 2009/0225010 | A1 | 9/2009 | Kimura |
| 2013/0265215 | A1* | 10/2013 | Liao ............... G09G 3/3233 345/82 |
| 2014/0192038 | A1 | 7/2014 | Qin et al. |

FOREIGN PATENT DOCUMENTS

| | | |
|---|---|---|
| CN | 101572053 A | 11/2009 |
| CN | 101572055 A | 11/2009 |
| CN | 102881253 A | 1/2013 |
| CN | 103077680 A | 5/2013 |
| CN | 103236237 A | 8/2013 |
| CN | 203179479 U | 9/2013 |
| CN | 103500556 A | 1/2014 |

OTHER PUBLICATIONS

Notice of Transmittal of the International Search Report of PCT/CN2014/085494 in Chinese, mailed Nov. 24, 2014.
Written Opinion of the International Searching Authority of PCT/CN2014/085494 in Chinese with English translation mailed Nov. 25, 2014.
Chinese Office Action of Chinese Application No. 201310468312.0, mailed Feb. 25, 2015 with English translation.
Patent Grant Notification for Chinese Patent CN 201310468312.0 issued on Oct. 19, 2015 in Chinese with the English translation.
Patent CN 103500556B issued on Dec. 2, 2015 which is the granted patent of CN 201310468312.0 filed on Oct. 9, 2013 with the granted claims in Chinese with an English translation.

* cited by examiner

US 9,489,894 B2

PIXEL CIRCUIT AND DRIVING METHOD THEREOF, AND THIN FILM TRANSISTOR BACKBOARD

CROSS REFERENCE TO RELATED APPLICATIONS

This application is the National Stage of PCT/CN2014/085494 filed on Aug. 29, 2014, which claims priority under 35 U.S.C. §119 of Chinese Application No. 201310468312.0 filed on Oct. 9, 2013, the disclosure of which is incorporated by reference.

TECHNICAL FIELD OF THE DISCLOSURE

The present disclosure relates to the field of display technology, in particular, to a pixel circuit and driving method thereof, and a thin film transistor (TFT) backboard.

BACKGROUND

OLED (Organic Light-Emitting Diode) as a current type OLED is increasingly applied to high performance active matrix display devices. Conventional passive matrix OLED display devices need shorter driving time for a single pixel with increase of display size, and thus require increased instantaneous current; thus increasing the power consumption. At the same time, the application of large current causes too large voltage drop on the nano ITO (Indium Tin metal Oxide) line, and causes too large operating voltage of the OLED, reducing its efficiency. On the contrary, those issues can be well addressed in the AMOLED (Active Matrix OLED) display devices by inputting OLED current through line by line scan using switch transistors.

In backboard design of AMOLED, the main issue needing to be addressed is the non-uniformity in brightness between compensation circuits of AMOLED pixel units. AMOLED uses TFTs to construct a pixel circuit to provide corresponding driving current for the OLED. As known, low temperature poly-crystal silicon TFTs or oxide TFTs are mostly used. Compared with a general amorphous silicon TFT, the low temperature poly-crystal silicon TFT and the oxide TFT have larger mobility and more stable characteristics, and are more suitable for be applied to AMOLED display. However, due to the limitation of crystallization process, the low temperature poly-crystal silicon TFTs fabricated on a large glass substrate usually have non-uniformity on electrical parameters such as threshold voltage, mobility and so on. Such non-uniformity will be converted to driving circuit variation and brightness variation of the OLEDs which can be perceived by human eyes, i.e., the mura phenomenon.

Generally, for the AMOLED fabricated by the oxide TFT transistor process technology, the type of the OLED in the pixel circuit can be P type or N type. However, whether the P type or the N type TFTs are selected to realize the pixel circuit, the current flowing through the OLEDs not only changes with the variation of the turning-on voltage of the OLEDs due to long time stress, but also are different from each other due to the threshold voltage drift of the TFTs for driving the OLEDs. As a result, the brightness uniformity and the brightness invariance of the OLED display are affected as well.

Therefore, in order to address the above issues, it is needed to provide a pixel circuit and driving method thereof, and a TFT backboard.

SUMMARY

The present disclosure provides a pixel circuit and driving method thereof, and a TFT backboard, which can address the issue of threshold voltage drift of driving transistor occurring during the driving of the pixel circuit.

According to one aspect of the present disclosure, there is provided a pixel circuit comprising a driving transistor, a signal loading module, a light emitting control module and a storage capacitor, wherein a gate of the driving transistor is connected to a third terminal of the signal loading module and a second terminal of the storage capacitor; a first terminal of the driving transistor is connected to a second terminal of the signal loading module and a second terminal of the light emitting control module; a second terminal of the driving transistor is connected to a fourth terminal of the signal loading module and a third terminal of the light emitting control module;

a first terminal of the storage capacitor is connected to a first terminal of the signal loading module and a first terminal of the light emitting control module;

a fifth terminal of the signal loading module receives a data signal;

both the first terminal of the light emitting control module and the first terminal of the signal loading module receive a first voltage signal; and a fourth terminal of the light emitting control module outputs a driving voltage signal.

Optionally, the signal loading module comprises a first transistor, a second transistor and a third transistor;

a gate of the first transistor receives a gate control signal for the present stage; a first terminal of the first transistor, as the third terminal of the signal loading module, is connected to the second terminal of the storage capacitor, the gate of the driving transistor and the second terminal of the second transistor; a second terminal of the first transistor, as the fourth terminal of the signal loading module, is connected to the second terminal of the driving transistor and the third terminal of the light emitting control module;

a gate of the second transistor receives a gate control signal for the previous stage or a start signal; a first terminal of the second transistor receives the first voltage signal, and as the first terminal of the signal loading module, is connected to the first terminal of the storage capacitor and the first terminal of the light emitting control module; a second terminal of the second transistor, as the third terminal of the signal loading module, is connected to the first terminal of the first transistor, the second terminal of the storage capacitor and the gate of the driving transistor;

a gate of the third transistor receives the gate control signal for the present stage; a first terminal of the third transistor receives a data signal; a second terminal of the third transistor, as the second terminal of the signal loading module, is connected to the first terminal of the driving transistor and the second terminal of the light emitting control module.

Optionally, the light emitting control module comprises a fourth transistor and a fifth transistor;

a gate of the fourth transistor receives a light emitting control signal; a first terminal of the fourth transistor receives a first voltage signal, and as the first terminal of the light emitting control module, is connected to the first terminal of the storage capacitor and the first terminal of the signal loading module; a second terminal of the fourth transistor, as the second terminal of the light emitting control module, is connected to the first terminal of the driving transistor and the second terminal of the signal loading module; and a gate of the fifth transistor receives the light emitting control signal; a first terminal of the fifth transistor, as the third terminal of the light emitting control module, is connected to the second terminal of the driving transistor and the fourth terminal of the signal loading module; a second terminal of the fifth transistor, as the fourth terminal of the light emitting control module, outputs the driving voltage signal.

Optionally, the pixel circuit further comprises an OLED which is connected to the fourth terminal of the light emitting control module and used to receive the driving voltage signal to emit light.

Optionally, the pixel circuit further comprises a first voltage signal source, wherein an output terminal of the first voltage signal source is connected to the first terminal of the signal loading module and the first terminal of the light emitting control module, and the first voltage signal source is used to output the first voltage signal to the signal loading module and the light emitting control module.

Optionally, the pixel circuit further comprises a second voltage signal source, wherein the driving transistor is an N type transistor; a first terminal of the OLED is connected to the fourth terminal of the light emitting control module; a second terminal of the OLED is connected to the second voltage signal source; the first voltage signal source is a high voltage signal source; and the second voltage signal source is a low voltage signal source.

Optionally, the pixel circuit further comprises a second voltage signal source, wherein the driving transistor is a P type transistor; a second terminal of the OLED is connected to the fourth terminal of the light emitting control module; a first terminal of the OLED is connected to the second voltage signal source; the first voltage signal source is a low voltage signal source; and the second voltage signal source is a high voltage signal source.

Optionally, the pixel circuit further comprises gate control signal sources and a start signal source, wherein the gate of the first transistor and the gate of the third transistor in the signal loading module are connected to the gate control signal source for the present stage; the gate of the second transistor in the signal loading module is connected to the gate control signal source for the previous stage or the start signal source; the gate control signal source for the present stage is used to output the gate control signal for the present stage; the gate control signal source for the previous stage is used to output the gate control signal for the previous stage; and the start signal source is used to output the start signal.

Optionally, the pixel circuit further comprises a light emitting control signal source, wherein the light emitting control signal source is connected to the gate of the fourth transistor and the gate of the fifth transistor in the light emitting control module, and the light emitting control signal source is used to output the light emitting control signal.

According to another aspect of the present disclosure, there is provided a driving method for the pixel circuit as described in the above, comprising:

in a reset phase, controlling the first terminal of the signal loading module to receive the first voltage signal and controlling the third terminal of the signal loading module to apply the first voltage signal to the second terminal of the storage capacitor, so as to reset the storage capacitor;

in a storage phase, turning on the driving transistor via the second terminal of the storage capacitor, discharging the second terminal of the storage capacitor to the second terminal of the signal loading module through the third terminal of the signal loading module, the fourth terminal of the signal loading module and the driving transistor; receiving the data signal via the second terminal of the signal loading module and applying the data signal to the second terminal of the storage capacitor via the driving transistor, and the fourth terminal of the signal loading module and the third terminal of the signal loading module; and in a light emitting phase, turning on the driving transistor continuously via the second terminal of the storage capacitor and applying the data signal to the driving transistor, receiving the first voltage signal via the first terminal of the light emitting control module and applying the same to the third terminal of the light emitting control module via the second terminal of the light emitting control module and the driving transistor, applying the data signal to the third terminal of the light emitting control module via the driving transistor, and outputting the driving voltage signal via the fourth terminal of the light emitting control module.

According to another aspect of the present disclosure, there is provided a TFT backboard comprising the pixel circuit as described in the above.

The pixel circuit of the present disclosure can effectively eliminate the non-uniformity due to the threshold voltage of the driving transistor itself and the afterimage phenomenon due to the threshold voltage drift when driving the OLED, avoid the display brightness non-uniformity due to different threshold voltages of the driving transistors between the OLEDs of different pixel units in the AMOLED display device, improve the driving performance of the pixel circuit on the OLED, and further improve the quality of the AMOLED display device.

BRIEF DESCRIPTION OF THE DRAWINGS

In the following, further descriptions will be made in connection with accompanying drawings and embodiments.

DETAILED DESCRIPTION

In the following, the technical solutions in embodiments of the present disclosure will be clearly and completely described in connection with accompanying drawings of the embodiments of the present disclosure. Obviously, the described embodiments are only part of the embodiments of the present disclosure, but not all of them. All other embodiments that can be obtained by those skilled in the art based on the embodiments in the present disclosure without paying any creative work fall within the protection scope of the present disclosure.

Figure 1:
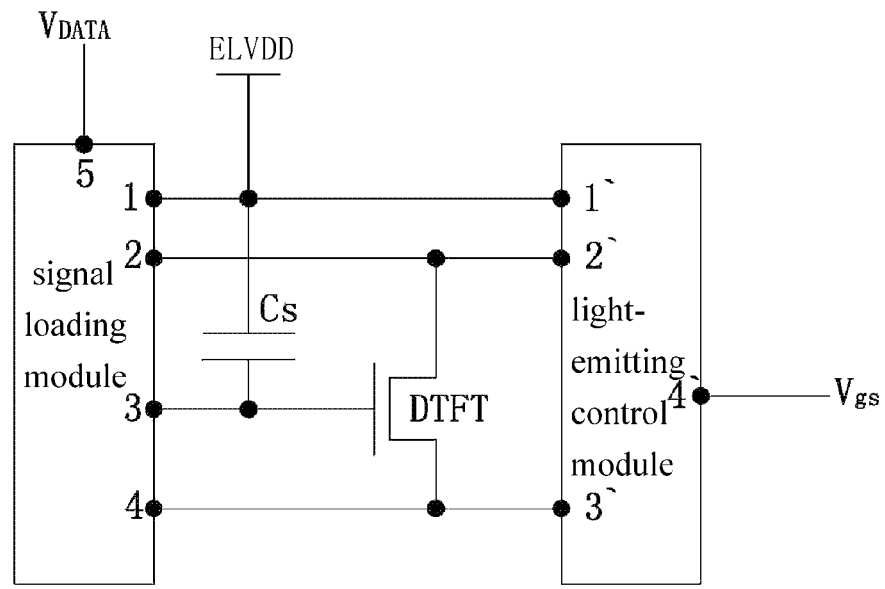
FIG. 1 is a schematic diagram illustrating a circuit connection of a pixel circuit in an embodiment of the present disclosure.

Referring to FIG. 1, in which reference signs 1, 2, 3, 4, 5 represent a first terminal, a second terminal, a third terminal, a fourth terminal and a fifth terminal of the signal loading module respectively; reference signs 1', 2', 3', 4' represent a first terminal, a second terminal, a third terminal and a fourth terminal of the light emitting control module respectively, the pixel circuits in an embodiment of the present disclosure can be used for compensating for the driving of OLEDs in the AMOLED display device. The driving of each OLED is compensated for by one pixel circuit, and each pixel circuit comprises a driving transistor DTFT, a signal loading module, a light emitting control module and a storage capacitor Cs.

A gate of the driving transistor DTFT is connected to a third terminal 3 of the signal loading module and a second terminal of the storage capacitor Cs; a first terminal of the driving transistor DTFT (i.e. the upper terminal of the DTFT as illustrated, a source) is connected to a second terminal 2 of the signal loading module and a second terminal 2' of the light emitting control module; a second terminal (i.e. the lower terminal of the DTFT as illustrated, a drain) of the driving transistor DTFT is connected to a fourth terminal 4 of the signal loading module and a third terminal 3' of the light emitting control module.

A first terminal of the storage capacitor Cs is connected to a first terminal 1 of the signal loading module and a first terminal 1' of the light emitting control module.

A fifth terminal 5 of the signal loading module receives a data signal $V_{DATA}$.

Both the first terminal 1' of the light emitting control module and the first terminal 1 of the signal loading module receive a first voltage signal ELVDD.

A fourth terminal 4' of the light emitting control module outputs a driving voltage signal Vgs.

The pixel circuit in the present embodiment further comprises an OLED which is connected to the fourth terminal 4' of the light emitting control module and used to receive the driving voltage signal Vgs for emitting light.

In the pixel circuit of the present embodiment, the signal loading module receives the data signal $V_{DATA}$, and applies the data signal $V_{DATA}$ to the second terminal of the storage capacitor Cs and the gate of the driving transistor DTFT, making the level at the second terminal of the storage capacitor Cs be raised to $V_{DATA}+V_{th}$, where $V_{th}$ is the threshold voltage of the driving transistor, so that the storage capacitor can sample and store the data signal $V_{DATA}$ and the threshold voltage $V_{th}$ of the driving transistor. In addition, since the voltage of the second terminal of the storage capacitor is equivalent to the gate voltage of the driving transistor, the gate voltage of the driving transistor is also $V_{DATA}+V_{th}$, and the gate voltage of the driving transistor is kept at $V_{DATA}+V_{th}$ continuously under the effect of the storage capacitor.

The light emitting control module receives the first voltage signal ELVDD to make the voltage of the first terminal of the driving transistor DTFT be the first voltage signal $V_{DD}$ and the voltage of the second terminal of the driving transistor DTFT be $V_{OLED}$, where $V_{OLED}$ is the voltage across the two terminals of the OLED. The computation equation for the driving voltage signal Vgs of the driving transistor is as Vgs=$V_{DATA}+V_{th}-V_{OLED}$.

The equation for the driving current input into the OLED through the driving transistor is as follows:

$$I_{OLED} = \frac{1}{2} \cdot K \cdot [V_{gs} - V_{th}]^2$$

where K is a current constant related to the driving transistor.

It can be derived by taking Vgs into the equation of the driving current $I_{OLED}$ that the driving current $I_{OLED}$ output to the OLED through the driving transistor is as follows:

$$I_{OLED} = \frac{1}{2} K \cdot [V_{DATA} + V_{th} - V_{OLED} - V_{th}]^2$$
$$= \frac{1}{2} K \cdot [V_{DATA} - V_{OLED}]^2.$$

It can be known from the above derivation that the driving current $I_{OLED}$ through the driving transistor only depends on $V_{DATA}$ and $V_{OLED}$, independent of the threshold voltage $V_{th}$ of the driving transistor; and $V_{OLED}$ approaches a constant after long time operation of the OLED. Therefore, even if $V_{th}$ is smaller than 0, it is possible to perform a good compensation, and substantially eliminate the effect of non-uniformity and drift of the threshold voltages. With the pixel circuit according to embodiments of the present disclosure, whether to take enhancement type or depletion type TFT as the driving transistor, it is possible to compensate for the effect of non-uniformity of the threshold voltages, and thus compensate for the non-uniformity in brightness of the OLEDs well. Therefore, it has wide applicability.

Compared with a conventional pixel structure, the above structure can effectively address the issues of threshold voltage drift and non-uniformity of the enhancement or depletion type driving transistor and voltage non-uniformity and aging of the OLED.

The pixel circuit of the present disclosure can effectively eliminate the non-uniformity due to the threshold voltage of the driving transistor itself and the afterimage phenomenon due to the threshold voltage drift when driving the OLED, avoid the non-uniformity in display brightness due to different threshold voltages of the driving transistors between the OLEDs of different pixel units in the AMOLED display device, improve the driving performance of the pixel circuit on the OLED, and further improve the quality of the AMOLED display device.

Figure 2:
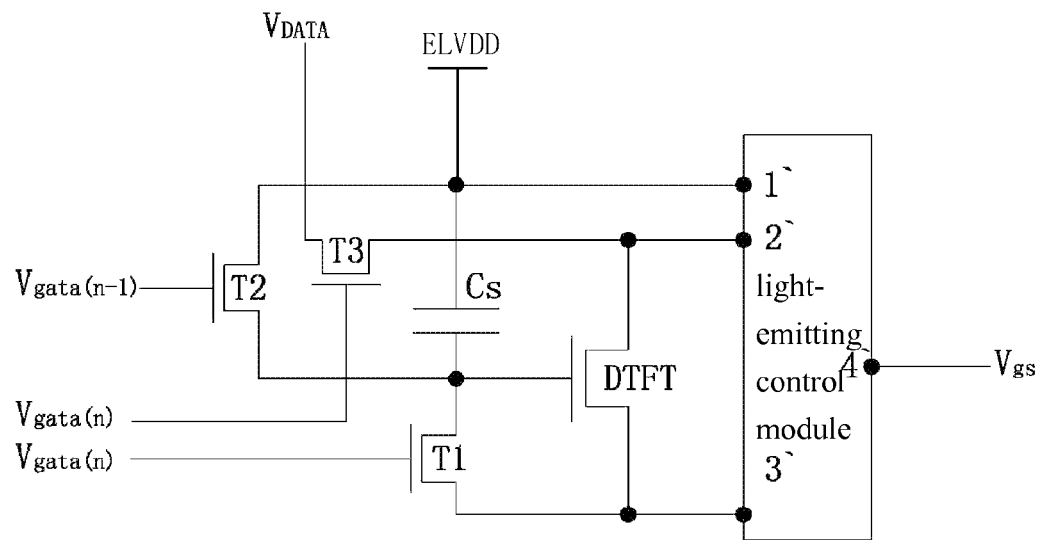
FIG. 2 is a schematic diagram illustrating a circuit connection of a pixel circuit in an embodiment of the present disclosure.

Referring to FIG. 2 (in FIG. 2, reference signs 1', 2', 3', 4' represent the first terminal, the second terminal, the third terminal and the fourth terminal of the light emitting control module respectively), the signal loading module in the present embodiment comprises a first transistor T1, a second transistor T2 and a third transistor T3.

A gate of the first transistor T1 receives a gate control signal $V_{Gate(n)}$ for the present stage; a first terminal of the first transistor, as the third terminal of the signal loading module, is connected to the second terminal of the storage capacitor Cs, the gate of the driving transistor DTFT and the second terminal of the second transistor T2; a second terminal of the first transistor T1, as the fourth terminal of the signal loading module, is connected to the second terminal of the driving transistor DTFT and the third terminal 3' of the light emitting control module.

A gate of the second transistor T2 receives a gate control signal $V_{Gate(n-1)}$ for the previous stage. The first stage of pixel circuit is supplied with a start signal since there is no gate control signal for its previous stage, wherein the start signal has the same function as a gate control signal for previous stage, and has the same timing sequence as a gate control signal for previous stage received by other stages of pixel circuits. A first terminal of the second transistor T2 receives the first voltage signal ELVDD, and as the first terminal of the signal loading module, is connected to the first terminal of the storage capacitor Cs and the first terminal 1' of the light emitting control module; a second terminal of the second transistor T2, as the third terminal of the signal loading module, is connected to the first terminal of the first transistor T1, the second terminal of the storage capacitor Cs and the gate of the driving transistor DTFT.

A gate of the third transistor T3 receives the gate control signal $V_{Gate(n)}$ for the present stage; a first terminal of the third transistor T3 receives a data signal $V_{DATA}$; a second terminal of the third transistor T3, as the second terminal of the signal loading module, is connected to the first terminal of the driving transistor DTFT and the second terminal 2' of the light emitting control module.

Figure 3:
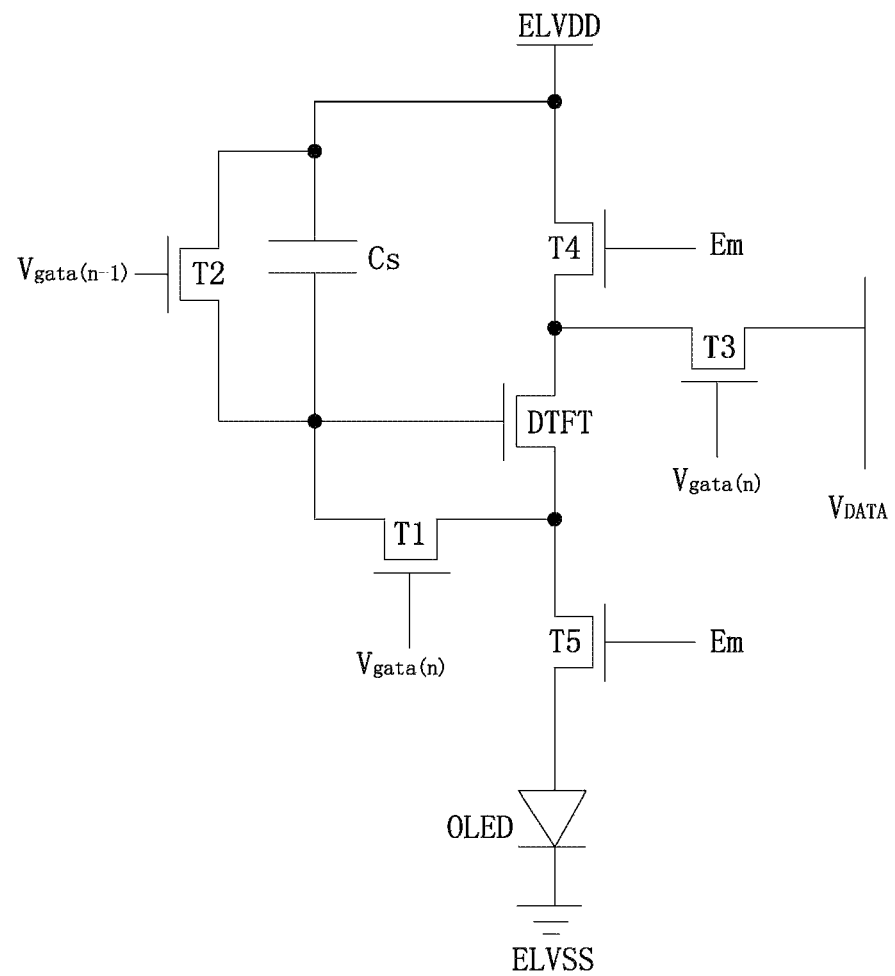
FIG. 3 is a schematic diagram illustrating a circuit connection of the pixel circuit in an embodiment of the present disclosure.

Referring to FIG. 3, the light emitting control module in the present embodiment comprises a fourth transistor T4 and a fifth transistor T5.

A gate of the fourth transistor T4 receives a light emitting control signal Em; a first terminal of the fourth transistor T4 receives a first voltage signal ELVDD, and as the first terminal of the light emitting control module, is connected to the first terminal of the storage capacitor CS and the first terminal of the second transistor T2 as the first terminal of the signal loading module; a second terminal of the fourth transistor T4, as the second terminal of the light emitting control module, is connected to the first terminal of the driving transistor and the second terminal of the third transistor T3 as the second terminal of the signal loading module.

A gate of the fifth transistor T5 receives the light emitting control signal Em; a first terminal of the fifth transistor T5, as the third terminal of the light emitting control module, is connected to the second terminal of the driving transistor and the second terminal of the first transistor T1 as the fourth terminal of the signal loading module; a second terminal of the fifth transistor T5, as the fourth terminal of the light emitting control module, outputs the driving voltage signal Vgs.

The pixel circuit in the present embodiment further comprises a first voltage signal source. An output terminal of the first voltage signal source is connected to the first terminal of the signal loading module and the first terminal of the light emitting control module, and the first voltage signal source is used to output the first voltage signal to the signal loading module and the light emitting control module.

The pixel circuit in the present embodiment further comprises a second voltage signal source, wherein the driving transistor is an N type transistor; a first terminal of the OLED is connected to the fourth terminal of the light emitting control module; a second terminal of the OLED is connected to the second voltage signal source; the first voltage signal ELVDD is a high voltage signal; and the second voltage signal source outputs a second voltage signal ELVSS which is a low voltage signal.

Of course, based on the above solution, it is easy to devise changing the driving transistor to P type transistor. Compared with the pixel circuit with N type transistor as the driving transistor, it suffices that the pixel circuit with P type transistor as the driving transistor only makes the following change in connection relationship.

The second terminal of the OLED is connected to the fourth terminal of the light emitting control module; the first terminal of the OLED is connected to the second voltage signal source; the first voltage signal is a low voltage signal; and the second voltage signal source outputs a second voltage signal which is a high voltage signal. The other structure and connection relationship in the pixel circuit are the same as those in the above described embodiment, which will not be repeated here.

In the present embodiment, the first terminal of the OLED is the anode, and the second terminal of the OLED is the cathode.

In the present embodiment, when the driving transistor is N type transistor, the second voltage ELVSS output by the second voltage signal source is normally selected from the range from −5V to 0V and is obtained according to practical experiment to provide a reference level for the above elements, for example to be connected to a zero line or a ground line to provide a zero level or a negative voltage. Accordingly, the first voltage signal ELVDD output by the first voltage signal source is a high voltage signal. When the driving transistor is P type transistor, the above is exactly opposite.

The pixel circuit in the present embodiment further comprises gate control signal sources. The gate of the first transistor T1 and the gate of the third transistor T3 in the signal loading module are connected to the gate control signal source for the present stage; the gate of the second transistor T2 in the signal loading module is connected to the gate control signal source for the previous stage; the gate control signal source for the present stage is used to output the gate control signal $V_{gate(n)}$ for the present stage; the gate control signal source for the previous stage is used to output the gate control signal $V_{gate(n-1)}$ for the previous stage; the first stage of pixel circuit is provided with a start signal source since there is no gate control signal source for its previous stage (the figures only schematically illustrate the structure of an intermediate stage of pixel circuit, so the start signal source is not illustrated). The start signal source is used to output the start signal.

The pixel circuit in the present embodiment further comprises a light emitting control signal source, wherein the light emitting control signal source is connected to the gate of the fourth transistor T4 and the gate of the fifth transistor T5 in the light emitting control module, and the light emitting control signal source is used to output the light emitting control signal Em.

The pixel circuit in embodiments of the present disclosure is connected to a light-emitting operational power source. The light-emitting operational power source provides the signal ELVDD of the first voltage signal source and the signal ELVSS of the second voltage signal source to the pixel circuit. The voltage ELVSS of the second voltage signal source is normally selected from the range from −5V to 0V and is obtained according to practical experiment to provide a reference level for the above elements, for example to be connected to a zero line or a ground line to provide a zero level or a negative voltage.

An embodiment of the present disclosure provides a TFT backboard comprising a pixel circuit as described in the above.

The pixel circuit and the TFT backboard of embodiments of the present disclosure can effectively eliminate the non-uniformity due to the threshold voltage of the driving transistor itself and the afterimage phenomenon due to the threshold voltage drift when driving the OLED, avoid the display brightness non-uniformity issue due to different threshold voltages of the driving transistors between the OLEDs of different pixel units in the AMOLED display device, improve the driving performance of the pixel circuit on the OLED, and further improve the quality of the AMOLED display device.

In the present embodiment, the driving transistor is an N type TFT, and the N type TFT is the enhancement type (the threshold voltage is positive) or the depletion type (the threshold voltage is negative). The first transistor, the second transistor, the third transistor, the fourth transistor and the fifth transistor are all N type TFTs. The first terminals of the driving transistor, the first transistor, the second transistor, the third transistor, the fourth transistor and the fifth transistor are the drains of respective transistors respectively, and the second terminals of the first transistor, the second transistor, the third transistor, the fourth transistor and the fifth transistor are the sources of respective transistors respectively. For example, when the first terminal of the driving transistor is the drain, the second terminal is the source. The drain and the source (the first terminal and the second terminal) of the above respective transistors can be exchanged according to the direction of the current following through the respective transistors. In the present embodiment, all the transistors are the N type TFTs; therefore, the direction in which the current flows is from the drain to the source of the transistor. However, since the source and the drain adopted herein are symmetrical, the source and the drain are exchangeable. If the source is selected as the signal input terminal, then the drain can be the signal output terminal, and vice versa.

Likewise, the driving transistor in the present embodiment can also be a P type TFT, and the P type TFT is the enhancement type (the threshold voltage is positive) or the depletion type (the threshold voltage is negative). The first transistor, the second transistor, the third transistor, the fourth transistor and the fifth transistor are all P type TFTs.

The present disclosure also provides a driving method realized in the above-described pixel circuit. The driving method is described in detail by taking a case in which the driving transistor is an N type TFT as an example.

Figure 4:
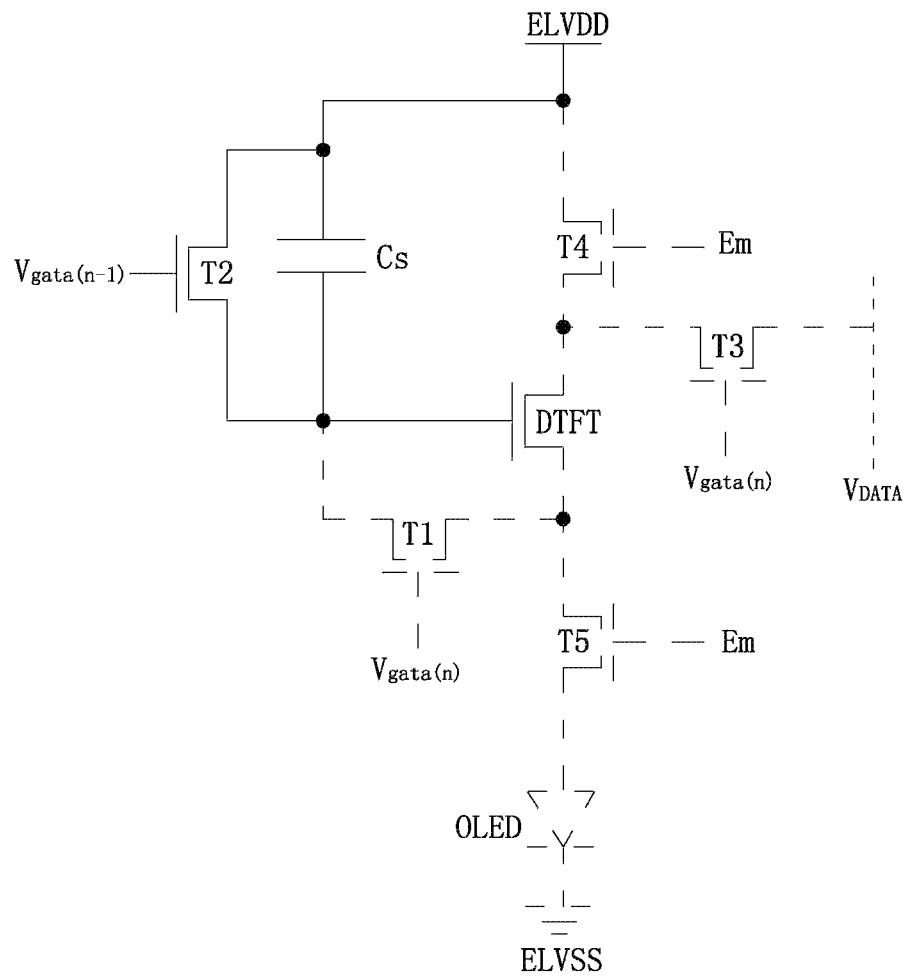
FIG. 4 is a schematic diagram illustrating a circuit connection of the pixel circuit in an embodiment of the present disclosure in a reset phase.
Figure 5:
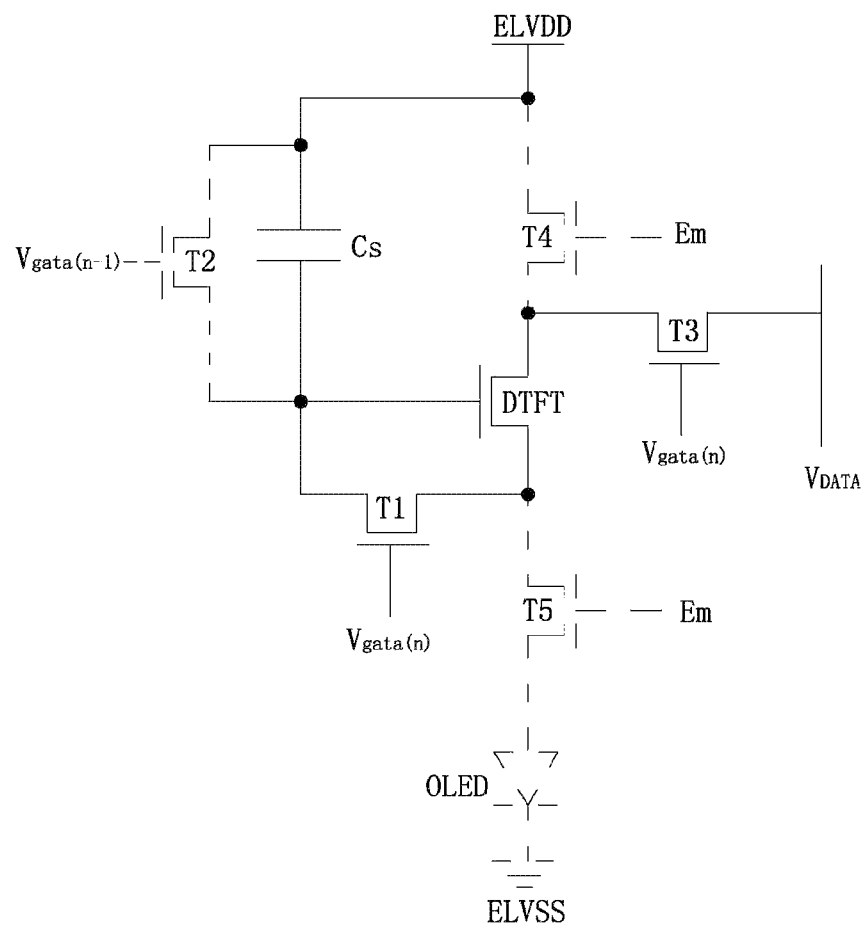
FIG. 5 is a schematic diagram illustrating a circuit connection of the pixel circuit in an embodiment of the present disclosure in a storage phase.
Figure 6:
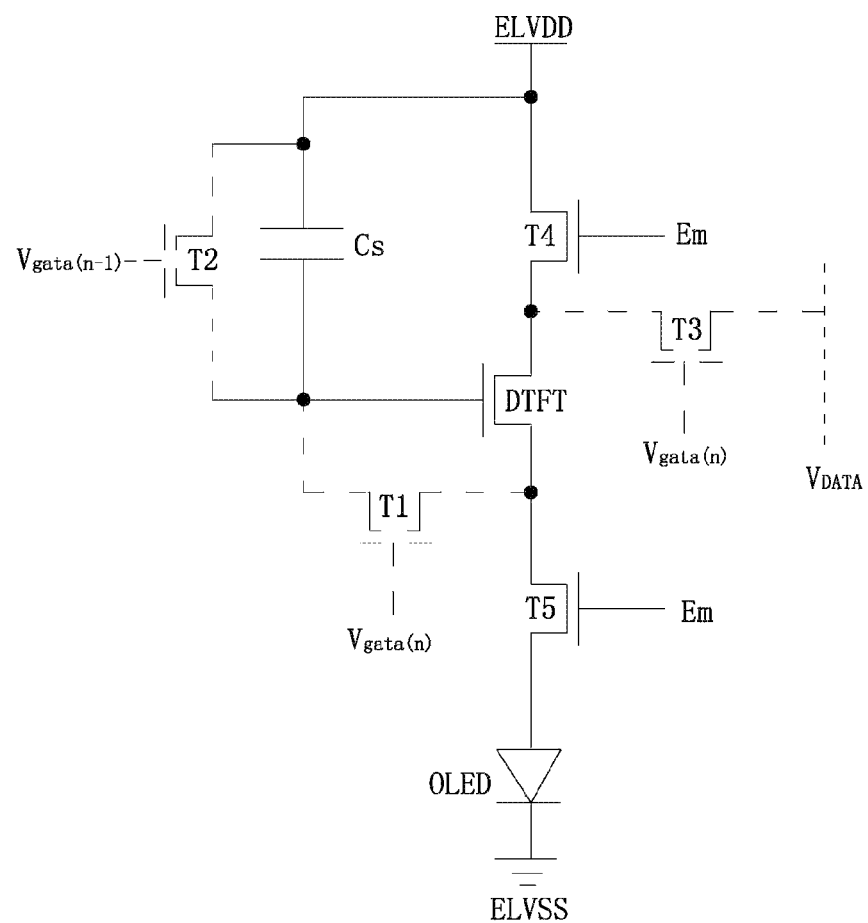
FIG. 6 is a schematic diagram illustrating a circuit connection of the pixel circuit in an embodiment of the present disclosure in a light emitting phase.
Figure 7:
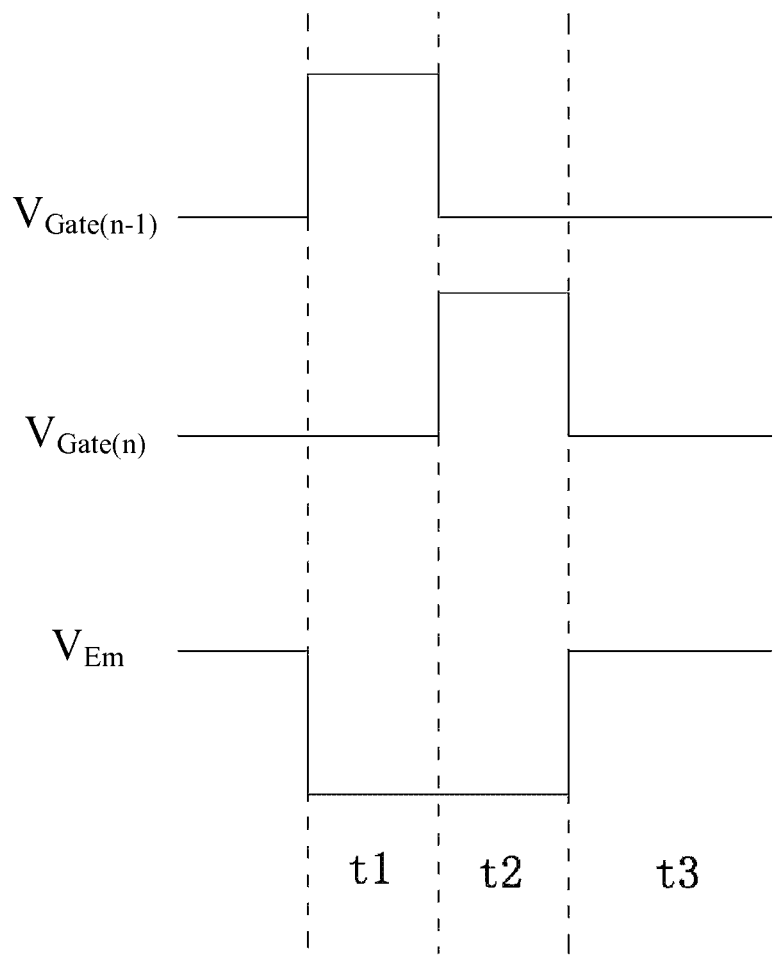
FIG. 7 is a schematic diagram illustrating a timing sequence control of a driving method in an embodiment of the present disclosure.

Referring to FIG. 4, FIG. 5, FIG. 6 and FIG. 7 (the dashed lines in FIG. 4, FIG. 5 and FIG. 6 illustrates a part of circuit which is not turned on; in FIG. 7, $V_{Gate(n-1)}$ is the electrical potential waveform of the gate control signal Gate(n-1) for the previous stage; $V_{Gate(n)}$ is the electrical potential waveform of the gate control signal Gate(n) for the present stage; $V_{Em}$ is the electrical potential waveform of the light emitting control signal Em; t1 is the reset phase; t2 is the storage phase; t4 is the light emitting phase, the method will be described in detail in connection with FIG. 7.

1. Referring to FIG. 4, at the reset phase, the first terminal of the signal loading module and the third terminal of the signal loading module are switched on so as to control the first terminal of the signal loading module to receive the first voltage signal; and control the first terminal of the signal loading module and the third terminal of the signal loading module to apply the first voltage signal to the first terminal and the second terminal of the storage capacitor respectively, in order to perform resetting for the storage capacitor.

In particular, the gate control signal for the previous stage outputs a high level. Now, the gate control signal for the present stage and the light emitting control signal both output a low level. The gate control signal for the previous stage turns on the second transistor, and the first transistor, the third transistor, the fourth transistor and the fifth transistor remain OFF.

The first voltage signal source applies the first voltage signal $V_{DD}$ to the second terminal of the storage capacitor to raise the level at the second terminal of the storage capacitor to $V_{DD}$, such as to perform resetting for the storage capacitor. In addition, since the voltage of the second terminal of the storage capacitor is equivalent to the gate voltage of the driving transistor, the gate voltage of the driving transistor is also $V_{DD}$.

2. Referring to FIG. 5, at the storage phase, the first terminal of the signal loading module and the third terminal of the signal loading module are disconnected from each other, and the signal loading module controls the voltage of the second terminal of the storage capacitor to turn on the driving transistor; the signal loading module controls the second terminal of the storage capacitor is discharged to the second terminal of the signal loading module via the third terminal of the signal loading module, the fourth terminal of the signal loading module and the driving transistor in turn; at the same time, the second terminal of the signal loading module is controlled to receive the data signal and apply the data signal to the second terminal of the storage capacitor and the gate of the driving transistor through the driving transistor, and the fourth terminal of the signal loading module and the third terminal of the signal loading module in turn.

In particular, the gate control signal for the present stage is at a high level, and the light emitting control signal and the gate control signal for the previous stage are at a low level. The gate control signal for the previous stage turns off the second transistor. The gate control signal for the present stage turns on the first transistor and the third transistor. The fourth transistor and the fifth transistor remain OFF.

The first terminal of the storage capacitor remains $V_{DD}$. The second terminal of the storage capacitor turns on the driving transistor and is discharged through the first transistor, the driving transistor and the third transistor.

The data signal $V_{DATA}$ is applied to the second terminal of the storage capacitor and the gate of the driving transistor through the third transistor, the driving transistor and the first transistor, making the second terminal of the storage capacitor to be raised to $V_{DATA}+V_{th}$, where $V_{th}$ is the threshold voltage of the driving transistor, so that the storage capacitor can sample and store the data signal $V_{DATA}$ and the threshold voltage $V_{th}$ of the driving transistor. In addition, since the voltage of the second terminal of the storage capacitor is equivalent to the gate voltage of the driving transistor, the gate voltage of the driving transistor is also $V_{DATA}+V_{th}$.

Referring to FIG. 6, at the light emitting phase, the second terminal of the storage capacitor turns on the driving transistor continuously and the data signal is applied to the driving transistor; the first terminal of the light emitting control module receives the first voltage signal and applies the same to the third terminal of the light emitting control module through the second terminal of the light emitting control module and the driving transistor; and the same time, the driving transistor applies the data signal to the third terminal of the light emitting control module, and the fourth terminal of the light emitting control module outputs the driving voltage signal under the control of the light emitting control module.

In particular, the light emitting control signal is at a high level, and the gate control signal for the present stage and the gate control signal for the previous stage are at a low level. The gate control signal for the previous stage turns off the second transistor, and the gate control signal for the present stage turns off the first transistor and the third transistor. The light emitting control signal turns on the fourth transistor and the fifth transistor; the first voltage signal source and the second voltage signal source are turned on continuously; at the same time, the electric charges stored at the second terminal of the storage capacitor continuously turn on the driving transistor to drive the OLED connected to the fourth terminal of the light emitting control module to emit light.

Now, the gate voltage of the driving transistor remains $V_{DATA}+V_{th}$. The first terminal voltage of the driving transistor is the first voltage signal $V_{DD}$ and the voltage of the second terminal of the driving transistor is $V_{OLED}$, where $V_{OLED}$ is the voltage across the two terminals of the OLED. The computation equation for the driving voltage signal Vgs of the driving transistor is Vgs=$V_{DATA}+V_{th}-V_{OLED}$.

The equation for the driving current input into the OLED through the driving transistor is:

$$I_{OLED} = \frac{1}{2} \cdot K \cdot [V_{gs} - V_{th}]^2$$

where K is a current constant related to the driving transistor.

It can be derived by taking Vgs into the equation of the driving current $I_{OLED}$ that the driving current $I_{OLED}$ output to the OLED through the driving transistor is:

$$I_{OLED} = \frac{1}{2} K \cdot [V_{DATA} + V_{th} - V_{OLED} - V_{th}]^2$$
$$= \frac{1}{2} K \cdot [V_{DATA} - V_{OLED}]^2.$$

It can be known from the procedure of the above driving method that the driving transistor always operates alternately between the positive bias state and the negative bias state. In particular, in the storage phase, the electric charges at the second terminal of the storage capacitor transfer to the first terminal of the driving transistor through the second terminal of the driving transistor; further, in the light emitting phase, the driving current $I_{OLED}$ transfer to the second terminal of the driving transistor through the first terminal of the driving transistor. With such a manner in which the operation state of the first terminal and that of the second terminal are exchanged alternately, it is possible to effectively alleviate the drift speed of the threshold voltage $V_{th}$ of the driving transistor.

The above descriptions are only specific implementations of the present disclosure, but the protection scope of the present disclosure is not limited to this. Changes or replacements that can be easily devised by those skilled in the art within the technical scope of the present disclosure should all fall within the protection scope of the present disclosure. Therefore, the protection scope of the present disclosure should be defined by the claims.

The present application claims the priority of Chinese Patent Application No. 201310468312.0 filed on Oct. 9, 2013, the entire content of which is incorporated as part of the present application by reference.

What is claimed is:

1. A pixel circuit comprising a driving transistor, a signal loading module, a light emitting control module and a storage capacitor, wherein a gate of the driving transistor is connected to a third terminal of the signal loading module and a second terminal of the storage capacitor; a first electrode of the driving transistor is connected to a second terminal of the signal loading module and a second terminal of the light emitting control module; a second electrode of the driving transistor is connected to a fourth terminal of the signal loading module and a third terminal of the light emitting control module;

a first terminal of the storage capacitor is connected to a first terminal of the signal loading module and a first terminal of the light emitting control module;

a fifth terminal of the signal loading module is configured to receive a data signal;

both the first terminal of the light emitting control module and the first terminal of the signal loading module are configured to receive a first voltage signal; and a fourth terminal of the light emitting control module is configured to output a driving voltage signal;

wherein the signal loading module comprises a first transistor, a second transistor and a third transistor;

a gate of the first transistor is configured to receive a gate control signal for a present stage; a first electrode of the first transistor, as the third terminal of the signal loading module, is connected to the second terminal of the storage capacitor, the gate of the driving transistor and a second electrode of the second transistor; a second electrode of the first transistor, as the fourth terminal of the signal loading module, is connected to the second electrode of the driving transistor and the third terminal of the light emitting control module;

a gate of the second transistor is configured to receive a gate control signal for a previous stage or a start signal; a first electrode of the second transistor is configured to receive the first voltage signal, and as the first terminal of the signal loading module, is connected to the first terminal of the storage capacitor and the first terminal of the light emitting control module; the second electrode of the second transistor, as the third terminal of the signal loading module, is connected to the first electrode of the first transistor, the second terminal of the storage capacitor and the gate of the driving transistor;

a gate of the third transistor is configured to receive the gate control signal for the present stage; a first electrode of the third transistor is configured to receive a data signal; a second electrode of the third transistor, as the second terminal of the signal loading module, is connected to the first electrode of the driving transistor and the second terminal of the light emitting control module.

2. The pixel circuit according to claim 1, wherein the light emitting control module comprises a fourth transistor and a fifth transistor;

a gate of the fourth transistor is configured to receive a light emitting control signal; a first electrode of the fourth transistor is configured to receive a first voltage signal, and as the first terminal of the light emitting control module, is connected to the first terminal of the storage capacitor and the first terminal of the signal loading module; a second electrode of the fourth transistor, as the second terminal of the light emitting control module, is connected to the first electrode of the driving transistor and the second terminal of the signal loading module;

a gate of the fifth transistor is configured to receive the light emitting control signal; a first electrode of the fifth transistor, as the third terminal of the light emitting control module, is connected to the second electrode of the driving transistor and the fourth terminal of the signal loading module; a second electrode of the fifth transistor, as the fourth terminal of the light emitting control module, is configured to output the driving voltage signal.

3. The pixel circuit according to claim 2, further comprising a light emitting control signal source, wherein the light emitting control signal source is connected to the gate of the fourth transistor and the gate of the fifth transistor in the light emitting control module, and the light emitting control signal source is configured to output the light emitting control signal.

4. The pixel circuit according to claim 1, further comprising an OLED, wherein the OLED is connected to the fourth terminal of the light emitting control module and is configured to receive the driving voltage signal to emit light.

5. The pixel circuit according to claim 1, further comprising a first voltage signal source, wherein an output terminal of the first voltage signal source is connected to the first terminal of the signal loading module and the first terminal of the light emitting control module, and the first voltage signal source is configured to output the first voltage signal to the signal loading module and the light emitting control module.

6. The pixel circuit according to claim 5, further comprising a second voltage signal source, wherein the driving transistor is an N type transistor; a first terminal of the OLED is connected to the fourth terminal of the light emitting control module, and a second terminal of the OLED is connected to the second voltage signal source; the first voltage signal source is a high voltage signal source, and the second voltage signal source is a low voltage signal source.

7. The pixel circuit according to claim 5, further comprising a second voltage signal source, wherein the driving transistor is a P type transistor; a second terminal of the OLED is connected to the fourth terminal of the light emitting control module, and a first terminal of the OLED is connected to the second voltage signal source; the first voltage signal source is a low voltage signal source, and the second voltage signal source is a high voltage signal source.

8. The pixel circuit according to claim 1, further comprising gate control signal sources and a start signal source, wherein the gate of the first transistor and the gate of the third transistor in the signal loading module are connected to the gate control signal source for the present stage; the gate of the second transistor in the signal loading module is connected to the gate control signal source for the previous stage or the start signal source; the gate control signal source for the present stage is configured to output the gate control signal for the present stage, and the gate control signal source for the previous stage is configured to output the gate control signal for the previous stage; and the start signal source is configured to output the start signal.

9. A driving method for the pixel circuit according to claim 1, comprising:
in a reset phase, controlling the first terminal of the signal loading module to receive the first voltage signal and controlling the third terminal of the signal loading module to apply the first voltage signal to the second terminal of the storage capacitor, so as to reset the storage capacitor;
in a storage phase, turning on the driving transistor via the second terminal of the storage capacitor; discharging the second terminal of the storage capacitor to the second terminal of the signal loading module through the third terminal of the signal loading module, the fourth terminal of the signal loading module and the driving transistor; receiving the data signal via the second terminal of the signal loading module and applying the data signal to the second terminal of the storage capacitor via the driving transistor, and the fourth terminal of the signal loading module and the third terminal of the signal loading module; and
in a light emitting phase, turning on the driving transistor continuously via the second terminal of the storage capacitor and applying the data signal to the driving transistor; receiving the first voltage signal via the first terminal of the light emitting control module and applying the same to the third terminal of the light emitting control module via the second terminal of the light emitting control module and the driving transistor; applying the data signal to the third terminal of the light emitting control module via the driving transistor; and outputting the driving voltage signal via the fourth terminal of the light emitting control module.

10. A TFT backboard comprising a pixel circuit according to claim 1.

11. The TFT backboard according to claim 10, wherein, in the pixel circuit, the light emitting control module comprises a fourth transistor and a fifth transistor;
a gate of the fourth transistor is configured to receive a light emitting control signal; a first electrode of the fourth transistor is configured to receive a first voltage signal, and as the first terminal of the light emitting control module, is connected to the first terminal of the storage capacitor and the first terminal of the signal loading module; a second electrode of the fourth transistor, as the second terminal of the light emitting control module, is connected to the first electrode of the driving transistor and the second terminal of the signal loading module;
a gate of the fifth transistor is configured to receive the light emitting control signal; a first electrode of the fifth transistor, as the third terminal of the light emitting control module, is connected to the second electrode of the driving transistor and the fourth terminal of the signal loading module; a second electrode of the fifth transistor, as the fourth terminal of the light emitting control module, is configured to output the driving voltage signal.

12. The TFT backboard according to claim 11, wherein the pixel circuit further comprises a light emitting control signal source, wherein the light emitting control signal source is connected to the gate of the fourth transistor and the gate of the fifth transistor in the light emitting control module, and the light emitting control signal source is configured to output the light emitting control signal.

13. The TFT backboard according to claim 10, wherein the pixel circuit further comprises an OLED, wherein the OLED is connected to the fourth terminal of the light emitting control module and is configured to receive the driving voltage signal to emit light.

14. The TFT backboard according to claim 10, wherein the pixel circuit further comprises a first voltage signal source, wherein an output terminal of the first voltage signal source is connected to the first terminal of the signal loading module and the first terminal of the light emitting control module, and the first voltage signal source is configured to output the first voltage signal to the signal loading module and the light emitting control module.

15. The TFT backboard according to claim 14, wherein the pixel circuit further comprises a second voltage signal source, wherein the driving transistor is an N type transistor; a first terminal of the OLED is connected to the fourth terminal of the light emitting control module, and a second terminal of the OLED is connected to the second voltage signal source; the first voltage signal source is a high voltage signal source, and the second voltage signal source is a low voltage signal source.

16. The TFT backboard according to claim 14, wherein the pixel circuit further comprises a second voltage signal source, wherein the driving transistor is a P type transistor; a second terminal of the OLED is connected to the fourth terminal of the light emitting control module, and a first terminal of the OLED is connected to the second voltage signal source; the first voltage signal source is a low voltage signal source, and the second voltage signal source is a high voltage signal source.

17. The TFT backboard according to claim 10, wherein the pixel circuit further comprises gate control signal sources and a start signal source, wherein the gate of the first transistor and the gate of the third transistor in the signal loading module are connected to the gate control signal source for the present stage; the gate of the second transistor in the signal loading module is connected to the gate control signal source for the previous stage or the start signal source; the gate control signal source for the present stage is configured to output the gate control signal for the present stage, and the gate control signal source for the previous stage is configured to output the gate control signal for the previous stage; and the start signal source is configured to output the start signal.

* * * * *